United States Patent
Dubhashi et al.

(10) Patent No.: US 6,362,964 B1
(45) Date of Patent: Mar. 26, 2002

(54) FLEXIBLE POWER ASSEMBLY

(75) Inventors: Ajit Dubhashi, Redondo Beach; Stephen Nicholas Siu, Los Angeles; Heny W. Lin, Cypress; Bertrand P. Vaysse, West Hollywood; Michael A. Corfield, Costa Mesa, all of CA (US)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 09/709,883

(22) Filed: Nov. 9, 2000

Related U.S. Application Data
(60) Provisional application No. 60/166,148, filed on Nov. 17, 1999.

(51) Int. Cl.$^7$ .................................................. H05K 7/20
(52) U.S. Cl. ........................ 361/707; 257/724; 361/719
(58) Field of Search ................................. 361/816, 818, 361/761, 764, 704, 705, 707, 713, 709–711, 717–719; 174/35 R, 52.3; 165/80.3, 185; 257/698, 704, 706, 712, 713, 723, 724

(56) References Cited

U.S. PATENT DOCUMENTS

| | | | |
|---|---|---|---|
| 5,012,386 A | * | 4/1991 | McShane et al. ............ 361/715 |
| 5,408,128 A | | 4/1995 | Furnival |
| 5,583,377 A | * | 12/1996 | Higgins III .................. 257/707 |
| 5,663,869 A | * | 9/1997 | Vinciarelli et al. .......... 361/707 |
| 5,670,749 A | * | 9/1997 | Wieloch et al. ............. 174/260 |
| 5,966,291 A | * | 10/1999 | Baumel et al. ............. 361/707 |
| 6,011,692 A | * | 1/2000 | Bergstedt et al. ........... 361/707 |
| 6,081,426 A | * | 6/2000 | Takeda et al. .............. 361/704 |
| 6,147,869 A | * | 11/2000 | Furnival ..................... 361/719 |

* cited by examiner

Primary Examiner—Gerald Tolin
(74) Attorney, Agent, or Firm—Ostrolenk, Faber, Gerb & Soffen, LLP

(57) ABSTRACT

A flexible power assembly (FPA) provides a new packaging concept suitable for motor control and other functions. An insulated metal substrate (IMS) supports power semiconductor devices and is mounted directly on a heatsink, which supports a circuit board that is mounted above and spaced from the top side of the IMS. There are provided devices that are mounted on the circuit board which are electrically connected to the power semiconductor devices. There may be a cavity in the circuit board allowing the top of the IMS to be exposed, and optionally providing access for bonding wires to the top of the circuit. Bonding pads may be provided on the circuit board for electrical connection with the bonding wires. A cover may be optionally provided to enclose a space over the cavity. Potting compound may be contained in the space created by the cavity.

30 Claims, 19 Drawing Sheets

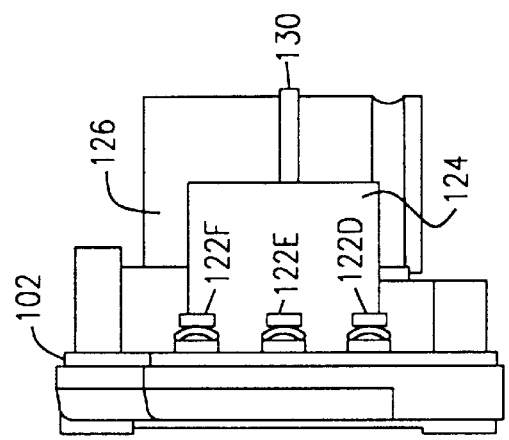
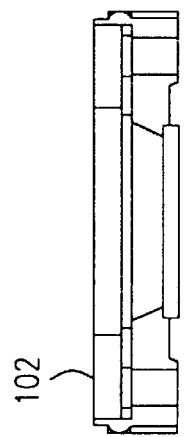
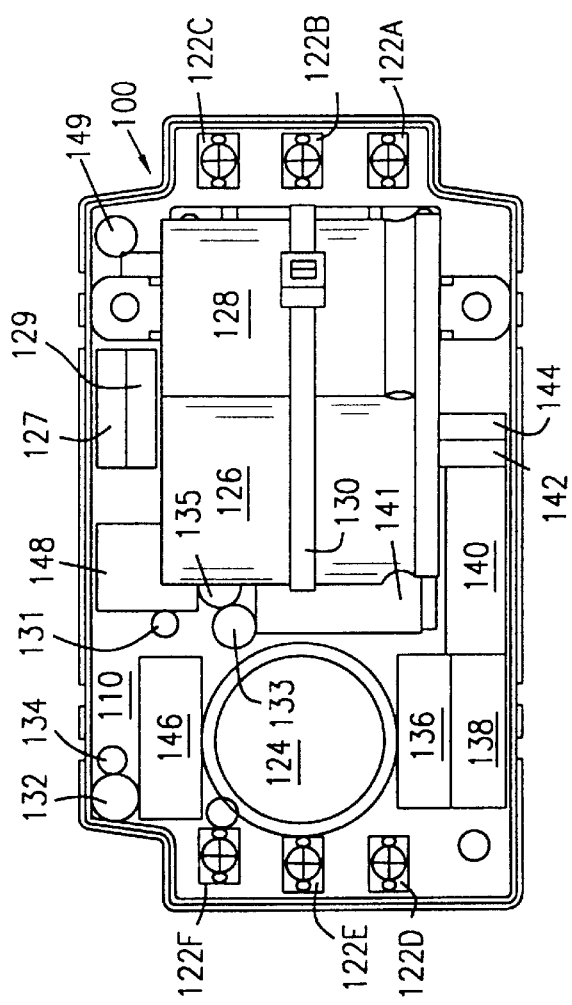
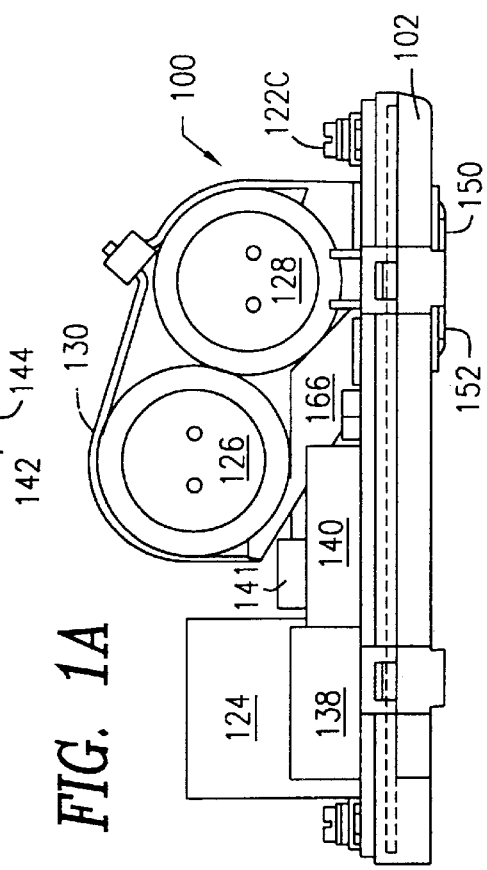
FIG. 1C
FIG. 1D
FIG. 1A
FIG. 1B

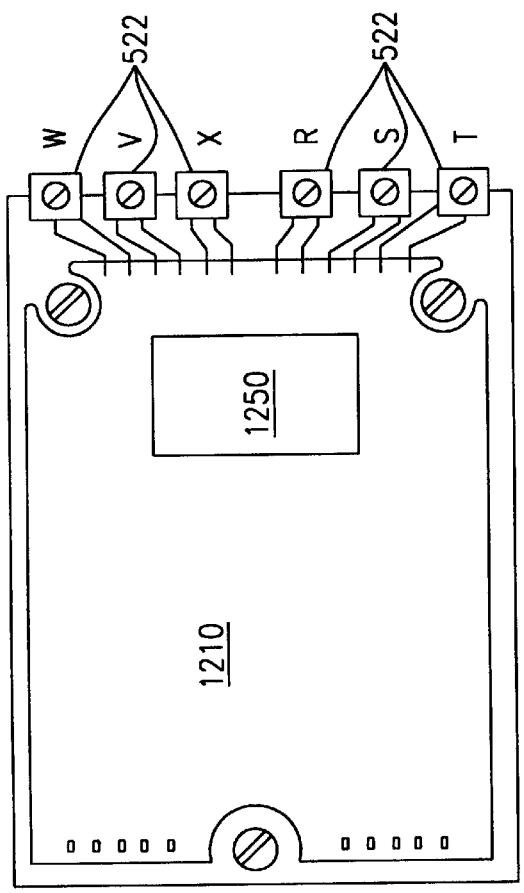
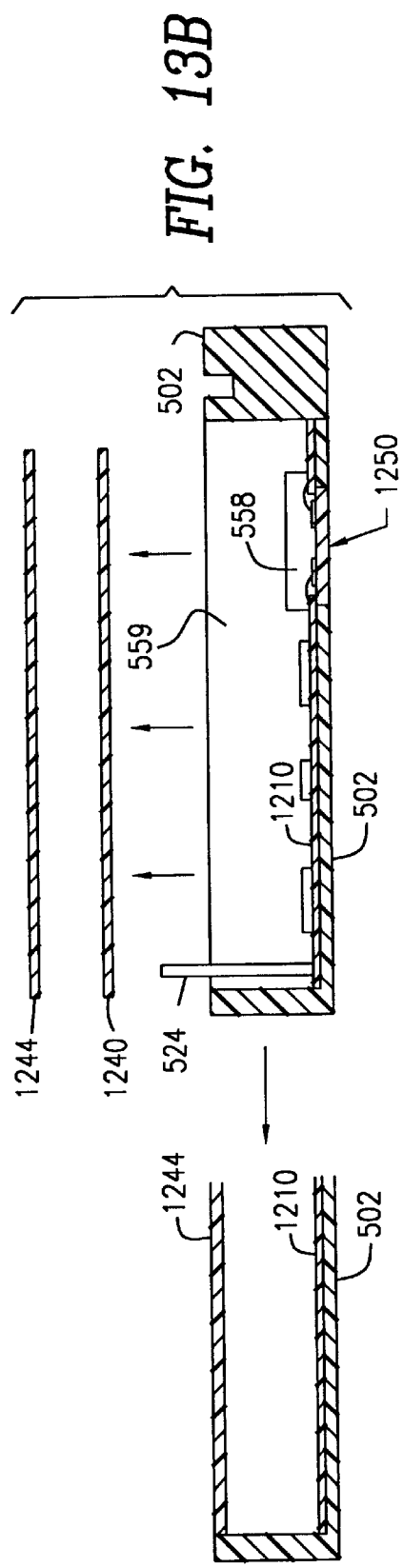
FIG. 13A
FIG. 13B

FLEXIBLE POWER ASSEMBLY

RELATED APPLICATION

This application is related to U.S. patent application Ser. No. 09/197,078, filed on Nov. 20, 1998 now U.S. Pat. No. 6,147,869. Priority is hereby claimed to U.S. Provisional patent application Ser. No. 60/166,148 filed on Nov. 17, 1999. The disclosures and subject matter of those applications are hereby incorporated by reference.

BACKGROUND OF THE INVENTION

The present invention relates to a semiconductor device module and, more specifically, relates to a novel module employing an insulated metal substrate (IMS), one or more power circuit boards, interconnects and other components that are arranged in a novel manner.

Known semiconductor device modules are used for housing a plurality of interconnected semiconductor chips. The chips may be of the same or of diverse kind and may be mounted on a heatsink or other substrate within a common housing having terminal electrodes which extend from the housing.

In a power application, such as for a motor control circuit or similar functions, both high power devices, from which heat must be removed, as well as low power devices, which do not require heatsinking, are employed. Typically, the heatsinking may be provided by mounting the devices on an IMS which is enclosed in a module housing. Such substrates and modules are described in U.S. Pat. No. 5,408,128, issued Apr. 18, 1995 in the name of the inventor of the present application and assigned to International Rectifier Corporation, the present assignee. However, when both high power and low power devices are required for an application, the inclusion of low power devices on an IMS greatly increases the cost of the module. Alternatively, the high power devices are included within the IMS module and the low power devices are mounted externally in other modules, thus greatly increasing the footprint of the circuit as well as requiring additional interconnections between the high and low power devices.

It is therefore desirable to provide a device package which houses both the high and low power devices and in which the package size is reduced, and the number and lengths of interconnects are minimized.

SUMMARY OF THE INVENTION

The present invention provides an "adaptable planar module" (APM), namely a new packaging concept for motor control and similar functions. The package is especially suited for low cost and small motor control systems, though the basic concept can be extended to larger, higher power systems.

The APM of the invention includes a minimum IMS substrate suitable for the power devices and other devices. The IMS substrate may support an input bridge, an inverter, and other components and sits beneath an open cavity of a printed circuit board ("PCB"). The PCB and the IMS substrate are potted in a molded shell that is provided with connectors. The PCB provides a low cost platform for the low power devices that do not require heatsinking and thus need not be situated on the IMS substrate. Interconnecting the IMS and the PCB are standard wire bonds that connect the semiconductor die on the IMS substrate and those on the PCB.

The invention thus eliminates redundant interconnects, provides cost savings and improves reliability. Specifically, the partitioning of the devices and the IMS size reduction save cost. The size reduction and direct bond to the die also reduce the unit IMS cost by eliminating the need for special plating and by allowing for a thinner IMS.

The APM of the present invention typically includes an IMS, a printed circuit board, a support base or shell, power terminals, and grounding terminals. Environmental considerations may also be taken into account. An external control PCB with keypad and I/O terminals, a cover, and a heatsink may also be included.

The IMS substrate of the APM may include an inverter, one or three phase inputs, a thermistor, a negative buss shunt and a ground fault shunt. Epoxy or solder die attachments may be used. The substrate may be suitable for any or all of 0.18, 0.37 or 0.75 kilowatt applications. The size of the substrate is, for example, 1.2 inches by 0.8 inches. Also, pollution 1 standard compliance with a coating may be provided, as may be 2500 V dielectric isolation.

The shell or package of the APM may include a molded shell that supports the IMS, the power PCB and the cover. The shell, for example, has a footprint of about 2.83 inches×5.12 inches (72×130 mm) with extended terminals. Three or four, for example, M4 mounting screws may be used for earth, panel, internal and heatsink grounding, respectively. The package preferably has a low profile of 0.375 inches, as an example, and may be made of high temperature and high strength plastic.

The power PCB of the APM may typically be a single PCB that can include a drive circuit, protection circuits, SMPS, filters, buss capacitors, soft-charge, terminals and a control board interface connector. The PCB is generally, for example, about 5.2 inches×2.6 inches. Preferably, the PCB is formed of two layers, though four layers are also possible. The top side of the PCB may include an SMD and a through-hole. The bottom side of the PCB may include a SMD of, preferably, up to 1.3 inches. The PCB may also include pollution 1 spacing with both sides coated or potted.

The power terminals are typically LMI or Schneider type. As an example, a three output motor is used as well as a two or three input line. The PCB may be grounded to earth at the input end, and preferably meets UL 508C specifications at 600V. The power terminals may be soldered to the power PCB.

Preferably, the APM conforms to a pollution level 2 requirement, though level 3 conformity may be provided if select control pins are managed. The APM may also be protected from vibration, shock and other mechanical stresses.

The primary grounding of the APM is preferably the heatsink. A motor shield may be clamped to the heatsink for EMC specification compliant grounding and for motor grounding to the heatsink. An input side mounting screw may connect the line earth, panel and panel ground to the heatsink and to the internal ground. A jumper from the heatsink that internally grounds the EMC terminal may also be provided.

A control PCB may be included in the APM or may be provided externally and interface with a connector and ribbon cable. The control PCB may preferably include a microprocessor, "shrubbery", keypad and a Wago I/O connector. The control PCB typically mechanically snaps into the cover and is connected by flex cable.

A cover may interface with the APM shell and is preferably a molded cover with a product-dependent height. The cover may provide a mechanical and electrical connection to the components, and may include a snap-on coupling to the shell and may permit mounting screws through the shell to the heatsink. The cover may also provide support for the control board and vents for capacitor cooling. Optionally, the cover is UL 50 specification compliant.

An external heatsink serves as the mounting surface for the APM. Three sizes are preferable for the heatsink, all of which preferably have the same footprint, namely an extruded aluminum heatsink for 0.37 kilowatt applications, extruded aluminum for 0.75 kilowatt applications, or an aluminum plate for 0.18 kilowatt applications. The heatsink is preferably sized for providing final power dissipation without using a fan. Typically, three or four tapped holes may be provided to connect the heatsink to the APM. The heatsink may also be mountable to a back panel or to a DIN rail.

The innovative shell design may provide any or all of the following features: location and support of the IMS substrate, optimum contact to the heatsink mounting surface, support of the PCB including wire bond support, space for SMD components on the bottom surface of the PCB, space for both SMD and leaded components on the top side of the PCB. A small depressed cavity above the IMS is provided for the IMS components and is preferably filled with a hi-grade potting compound that contacts the IMS die. The remainder of the package, including the PCB and other components, can thus be covered with a lower cost potting compound.

The shell may also create an external terminal housing, when such a housing is more cost effective than using procured terminals. Alternatively, the shell can create a partitioned area to attach procured terminals to the PCB.

Other, larger components such as buss capacitors, filter capacitors, and inductors may require special mounting and interconnects. These components may be attached to the PCB and may be allowed to protrude from the potting compound, or they may be placed atop an additional PCB. The additional PCB may be a co-planar extension of the first PCB or may be situated on a second level, depending on the size, number and cost of the component mounting, and will differ from one product to another. It may be advantageous, in some packages, to attach the larger components, such as the buss capacitors, to the bottom of the package and include an appropriate cover.

The top surface of the package may also accommodate a control key board which leads to the PCB.

Other applications, such as for appliances, may not require terminals and may incorporate lower cost fast-on connectors. Applications such as industrial controllers may add extra functions as well as higher power and mechanical structures.

The adaptability of the Adaptable Planar Module allows for flexibility in the design of products by modifying the layout of either the PCB or the IMS without any significant change in hard tooling. Other changes can also be made by building the shell mold with a changeable insert for the IMS substrate cavity or by incorporating a multiple upper mold cavity to accommodate higher walls for double boards, special connectors, an optional keyboard, and the like.

Thus, the APM provides a low cost package that allows for fuller system integration in a single module. Specific system functions may include: an inverter, input bridge, current sensing, short circuit and overtemperature protection, driver circuits, input/output filters, PFC, brake, a control microprocessor, and a keyboard.

In accordance with the invention, a semiconductor device module includes a support base that has an opening which extends from its top surface to its bottom surface. A planar, thermally conductive substrate extends across the support base opening and has a bottom surface that is situated at or below the bottom surface of the support base for contacting an external heatsink. One or more semiconductor devices are mounted on a top surface of the thermally conductive substrate. At least one circuit board is arranged above and is spaced from the top surface of the support base and has an opening that is situated above the thermally conductive substrate, and one or more other semiconductor devices are mounted on a top surface of the circuit board. At least one bonding pad area is arranged at a periphery of the opening in the circuit board and is electrically connected to the semiconductor devices of the circuit board. One or more bonding wires connect the semiconductor devices of the thermally conductive substrate to the bonding pad.

Other aspects of the invention include a motor drive module and a micro-converter module.

Plural, interconnected semiconductor devices may be mounted on thermally conductive substrate. The thermally conductive substrate may be an IMS. A power die or an inverter circuit may be mounted on the thermally conductive substrate.

The support base may include raised portions which extend above the support base top surface and which surrounds the opening in the circuit board to form a cavity above the thermally conductive substrate. The cavity may be filled with a high grade potting material, and at least part of a region atop the surface board may be filled with a low grade potting material. Further raised portions in the support base may support the circuit board.

Integral terminals, mounted atop the circuit board, or procured terminals, formed in a raised portion of the support base, may provide electrical connections and are electrically connected with the devices of the circuit board. Another circuit board may be mounted above and spaced from the circuit board, or may be mounted co-planar with the circuit board, and has further devices mounted on its surface. A keyboard may be mounted atop one of the circuit boards, and additional devices may be mounted on the bottom surface.

The present invention may be modified to provide a "flexible power assembly" (FPA), namely a new packaging concept for motor control and similar functions. The package is especially suited for low cost and small motor control systems, though the basic concept can be extended to larger, higher power systems.

The FPA of the present invention includes an IMS suitable for the power devices and other devices. The IMS may support an input bridge, an inverter, and other components and may sit beneath an open cavity of a printed circuit board ("PCB"). The PCB and the IMS are potted in a molded cover that is provided with connectors. The PCB provides a low cost platform for the low power devices that do not require heatsinking and thus need not be situated on the IMS. The IMS and the PCB may be interconnected by standard wire bonds that connect the semiconductor die on the IMS and other devices and components on the PCB. An FPA according to the present invention includes a heatsink that supports the substrate and the PCB.

In accordance with this invention, a semiconductor device module includes a heatsink directly supporting a thermally conductive substrate. One or more semiconductor devices are mounted on the thermally conductive substrate and are electrically connected to other devices that are mounted on a PCB. The PCB is situated above the thermally conductive substrate, and may include a cavity. The cavity in the PCB extends from the top surface of the PCB to its bottom, and is positioned above the thermally conductive substrate so that the semiconductor devices on the thermally conductive substrate are exposed. One or more bonding wires may provide the electrical connection between the semiconductor device or devices on the thermally conductive substrate and the device or devices on the PCB.

The cavity may be made wide enough so that the thermally conductive substrate protrudes through the cavity entirely, and the edges of the cavity on the underside of the PCB may be placed in contact with the top of an insulation element, which on its bottom side is in contact with the top of the heatsink.

In yet another embodiment, the cavity in the PCB may also be made narrow enough so that the edges of the cavity on the underside of the PCB will rest on the thermally conductive substrate resulting in the closing of the cavity by the body of the thermally conductive substrate.

The semiconductor device module according to the foregoing may further include a molded cover to reside on the top surface of, and over the cavity in, the PCB, such that the molded cover will enclose a space above the thermally conductive substrate. The space may then be filled with a potting compound.

In another embodiment, no cavity is provided in the PCB. Instead, an enclosure means surrounding the semiconductor device or devices is provided. The enclosure means meets the top of the thermally conductive substrate and the underside of the PCB thereby providing an enclosed space over the semiconductor device or devices, thus eliminating the need for a molded cover. Potting compound may then be contained in the enclosed space. Electrical connection by means of a via may then be made between the semiconductor device or devices and a device on the PCB.

Other features and advantages of the present invention will become apparent from the following description of the invention which refers to the accompanying drawings.

BRIEF DESCRIPTION OF THE DRAWINGS

The invention will now be described in greater detail in the following detailed description with the reference to the drawings in which:

FIGS. 1A, 1B, 1C and 1D show top, side, front and rear end views, respectively, of an adaptable planar module according to an embodiment of the invention.

FIGS. 13A and 13B show respective top and side views of an example of a ½ HP motor control module which is capable of housing the IMS of FIG. 13.

DETAILED DESCRIPTION OF THE INVENTION

Figure 2:
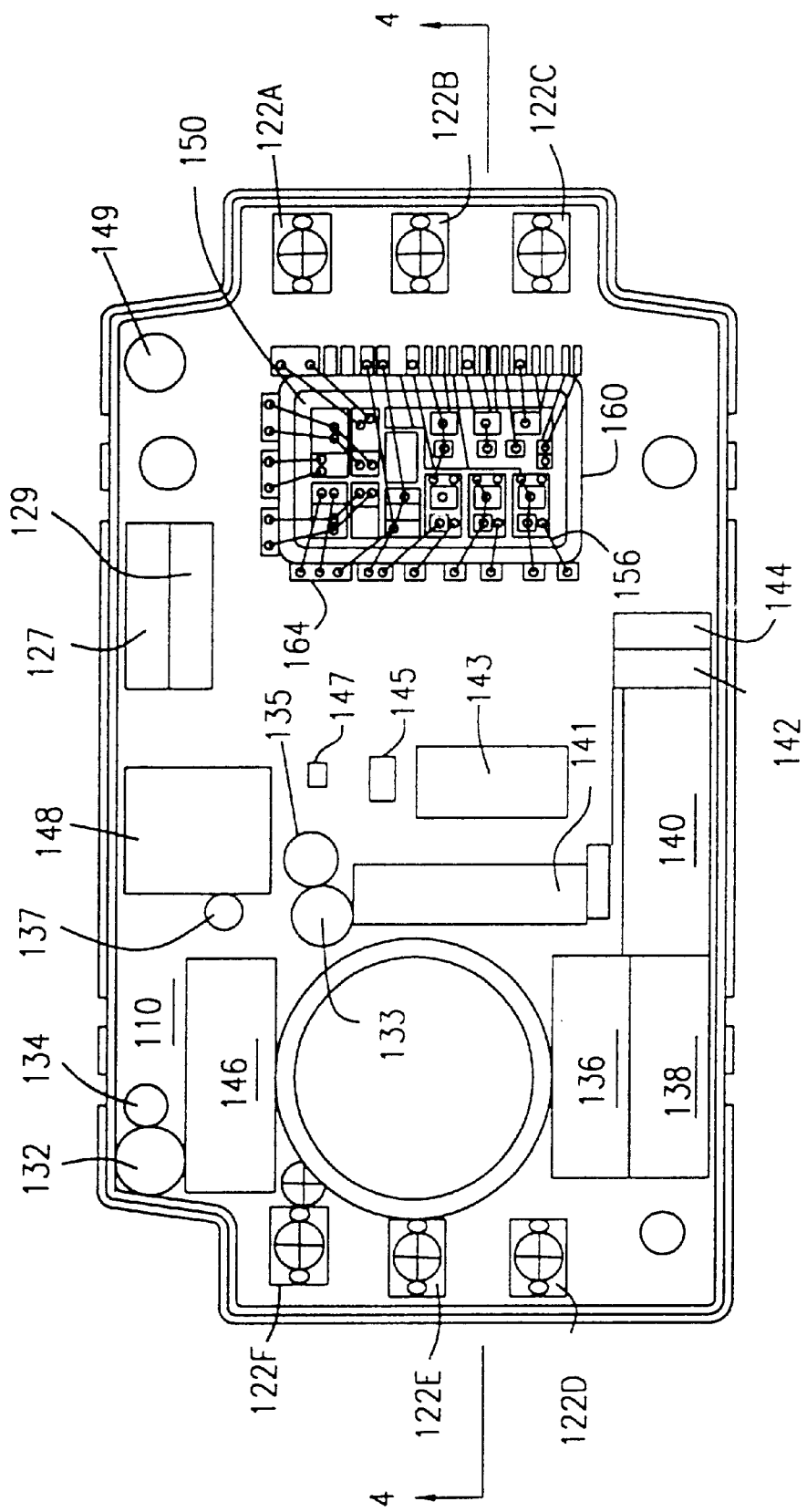
FIG. 2 shows a top view of the module of FIGS. 1A–1D with the IMS exposed.

Referring first to FIG. 1, there is shown in FIGS. 1A–1D an APM 100 according to an embodiment of the invention.

The APM includes a support base 102 which supports a printed circuit board 110. Mounted atop printed circuit board 110 are various electrical components including choke 124, resistors 130, 131, 132, 133, 134, capacitors 136, 138, transformer 148, inductors 141 and 146 as well as additional circuit elements 140, 142 and 144 and other components, all of which are interconnected by printed wiring (not shown) on circuit board 110. Also provided are I/O pins 127 and 129 and terminals 122A–122F which provide external connections to the circuit board. A support tray 131 rests atop circuit board 110 and supports capacitors 126 and 128 which are electrically connected to circuit board 110 and which are held in place by belt 130.

FIG. 2 shows the top view shown in FIG. 1A of APM 100 but with the support tray and its capacitors removed. An opening 160 formed in circuit board 110 is situated above an IMS 150. Bonding pads 164 are arranged around the periphery of opening 160 and are electrically connected to the other components mounted on the board. Bonding wires 156 provide electrical connections between the bonding pads 164 of the circuit board and the components mounted on IMS 150.

Figure 3:
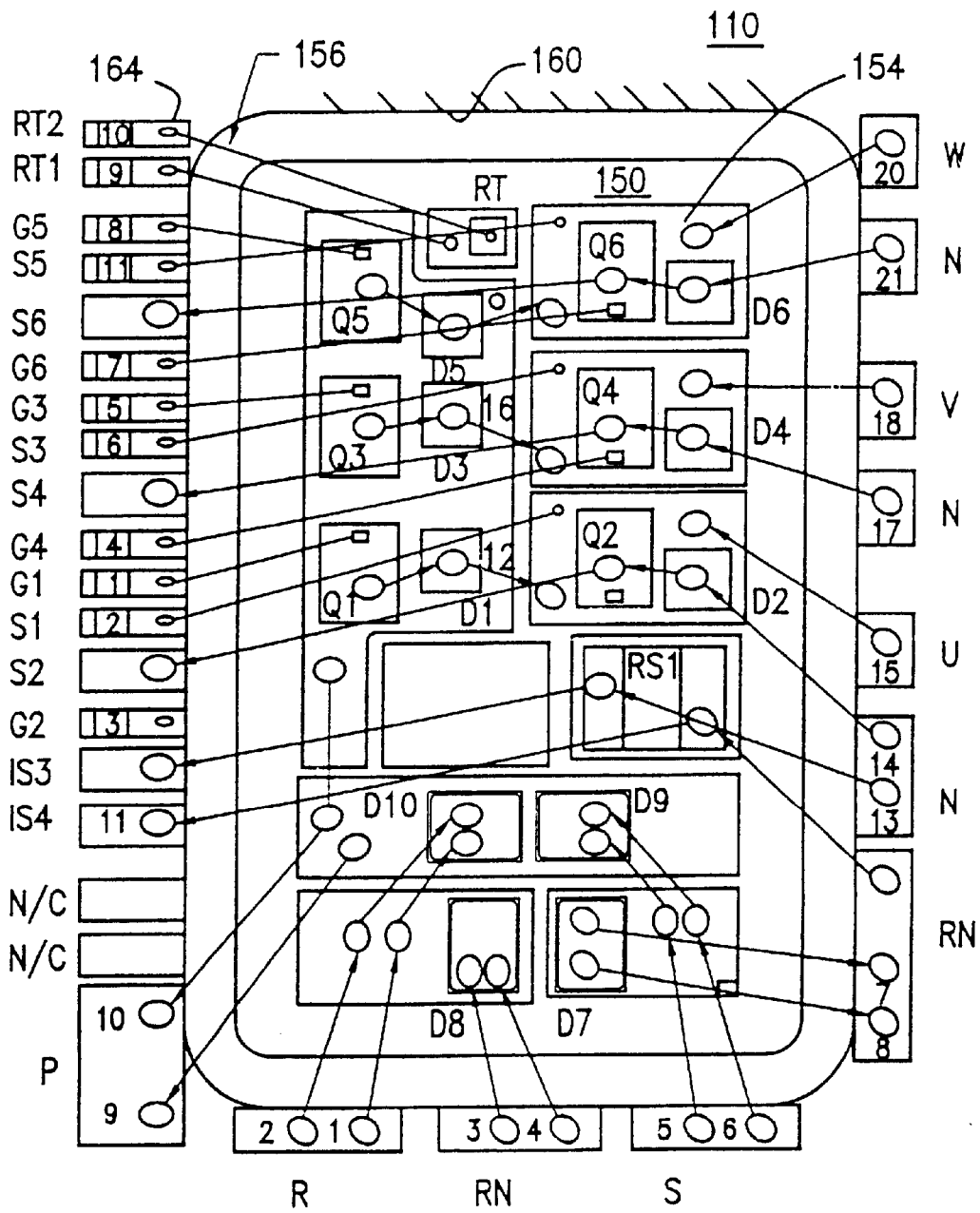
FIG. 3 shows the IMS substrate and its interconnect to the PCB of FIG. 2 in greater detail.

FIG. 3 shows the top view of the IMS as well as a portion of the circuit board 110 that surrounds opening 160 in greater detail. Mounted atop IMS 150 are various components including MOS-gate controlled power semiconductor devices Q1–Q6, diodes D1–D10 as well as resistors RT and RS1. Each of these components are thermally and electrically mounted atop portions of a conducting patterned material 154, such as copper. Also present, on the top surfaces of the devices, are bonding pad areas. Bonding wires 156 provide connections from the various components as well as from bonding pads 164 to the conducting pattern and the pad areas of the IMS components.

Figure 4A:
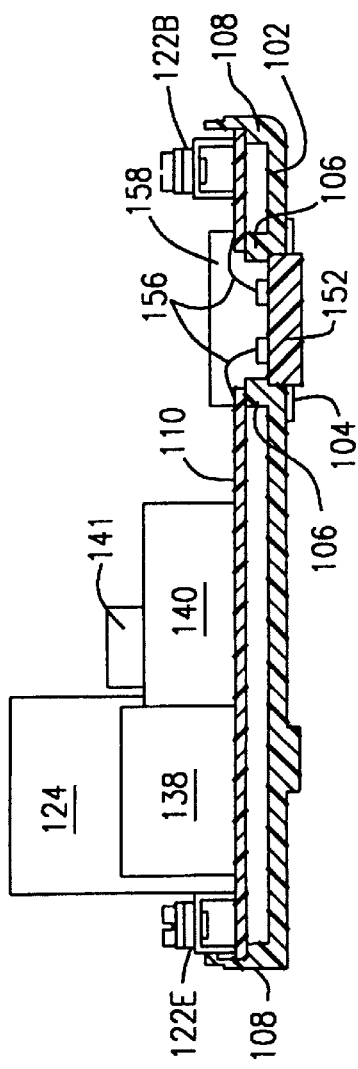
FIG. 4A shows a cross-sectional view of the PCB of FIG. 1A taken along lines 4—4.

FIG. 4A illustrates a cross-sectional view of the structure of FIG. 2. The IMS has a relatively thick body 152 formed of a conductive metal, such as aluminum, that is covered by a very thin insulation layer which, in turn, carries the conductive pattern which is electrically insulated from the body. Also present are heat spreaders (not shown) to which the components are mounted for improving thermal management of the heat generated by the components during their operation. An example of an IMS is described in the above-mentioned U.S. Pat. No. 5,408,128, which is incorporated herein by reference.

Significantly, the IMS is mounted in an opening of the support body 102 such that it is situated below the circuit board 110 and such that the bottom surface of the body 152 is located co-planar with or below the bottom surface 104 of support body 102 and is available for thermal contact with a heatsink (not shown). Also present, preferably, are raised portions 106 and 108 which extends from support body 102 and support the circuit board 110 at the opening and periphery, respectively, of the circuit board 110. The raised portions 106 and the opening in the circuit board form a cavity above the IMS which is filled with a high grade potting material 158 to cover the top surface of the IMS. A lower grade, and less costly, potting material can then be used between the bottom surface of the circuit board and the support body as well as to cover at least a portion of the components mounted atop the circuit board.

Figure 4B:
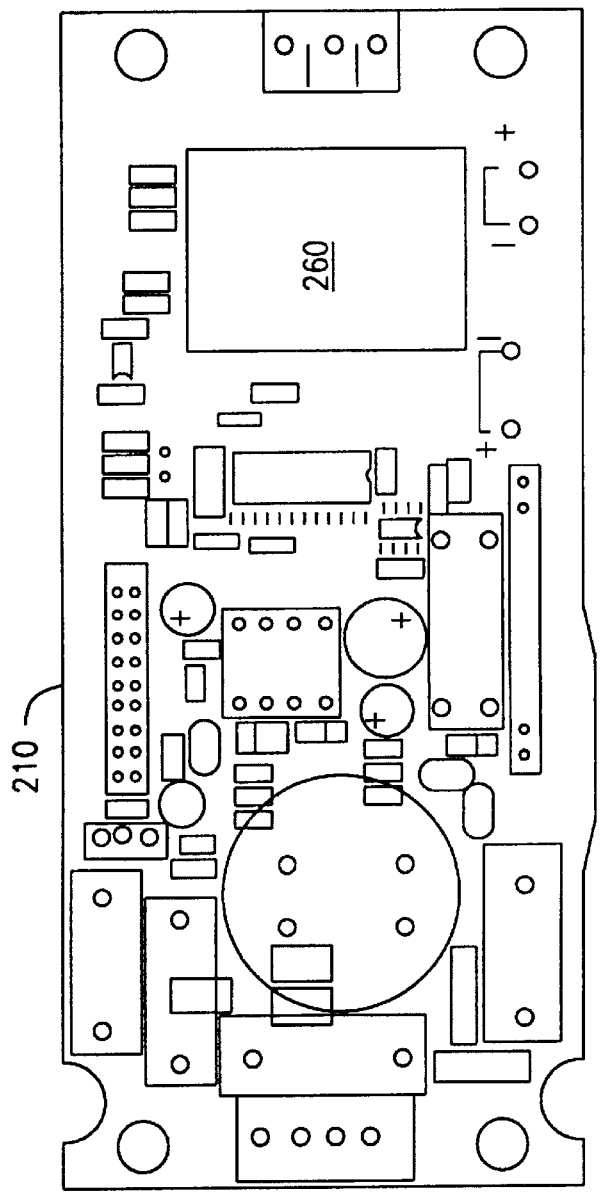
FIG. 4B shows a top view of the PCB.

FIG. 4B shows an example of a circuit board 210 which is suitable for mounting components as well as having an opening 260 that is to be situated above the IMS and employed in the manner of the invention.

Advantageously, and in accordance with the invention, the arrangement of the opening in the circuit board above the IMS minimizes the number and the length of the bonding wires that connect the components mounted atop the IMS and those mounted on the circuit board. Moreover, by mounting only the high power components on the IMS, the cost of the module is greatly reduced. Further, because both the high power and low power components are mounted in the same module, the footprint is greatly reduced, and the number of interconnections is further decreased. Additionally, by limiting the high grade potting compound to only the region atop the IMS, the cost of the module is also reduced.

It should also be noted that a cover, such as a molded cover, (not shown) may be supplied atop the circuit board to cover the components of the circuit board and the IMS and is preferably supported by the periphery of the support base.

Other packages have also been generated for motor controllers in the 0.1 to 1.0 HP range.

Figure 5A:
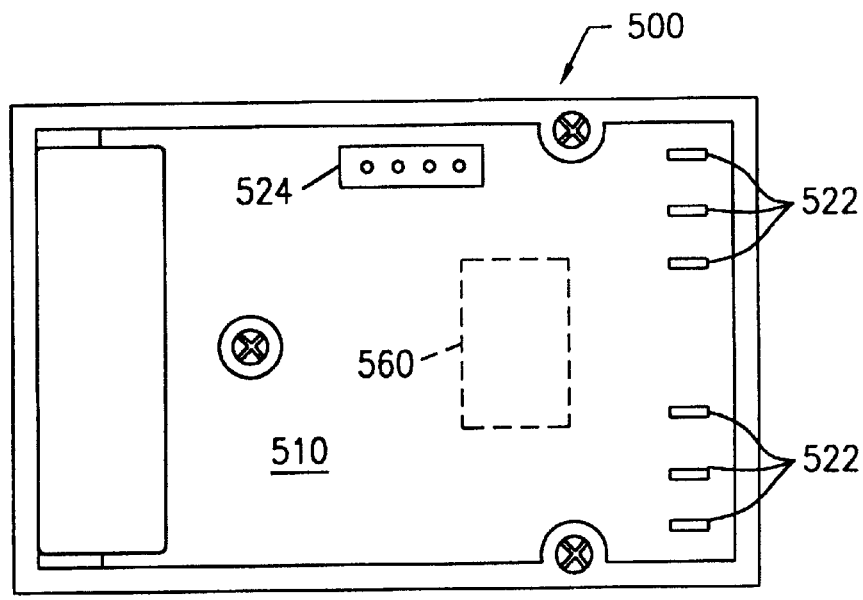
FIGS. 5A and 5B show a top view and a cross-sectional view, respectively, of an adaptable planar module according to a further embodiment of the invention.
Figure 5B:
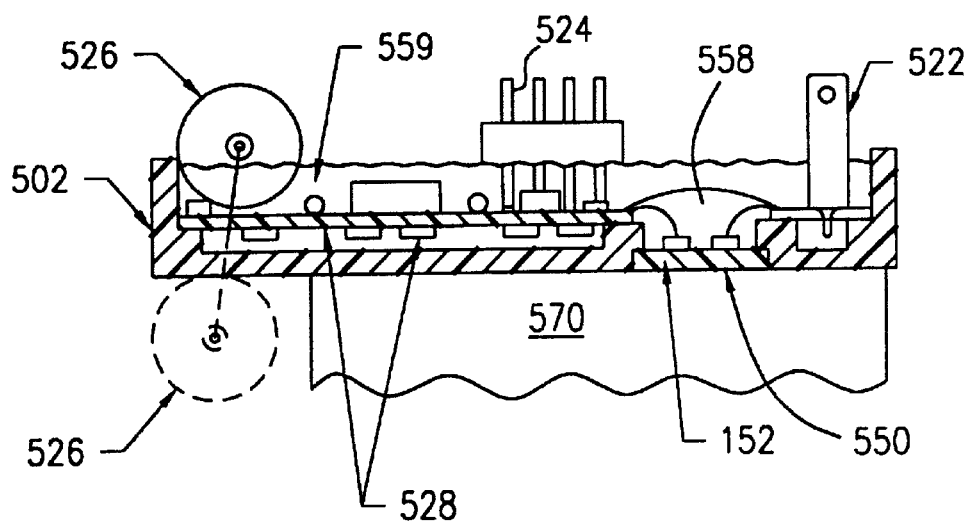

FIGS. 5A and 5B show an example of appliance APM package 500 with no input/output filters in accordance with another embodiment of the invention. A molded shell support base 502 supports a printed circuit board 510 and has an opening through which IMS 550 is mounted. The bottom surface of the IMS 550 contacts heatsink 570 to remove heat from the power devices mounted atop the IMS, as described above. Also, an opening 560 formed in the circuit board is situated atop the IMS to minimize the length of the wire bonds. As also described above, a high grade potting material 558 fills a cavity region above the IMS, and a lower grade potting material 559 is present elsewhere in the module. It should also be noted that components 528 are mounted both on the top and bottom surfaces of the module.

Here, the terminals 522 are fast-on connectors with in-line connector pins for providing control signals. Also shown are optional input/output pins 524. The typically 3.0"×2.0"×0.5" package can house a full motor control circuit, including an inverter circuit, input circuits, protection circuits and a microprocessor. The inverter and input circuits 512 are located on the IMS 550, and other components 528 are located on the circuit board 510. The 3.0 inch length is a protective maximum size, though streamlined products may be smaller in size.

Figure 6A:
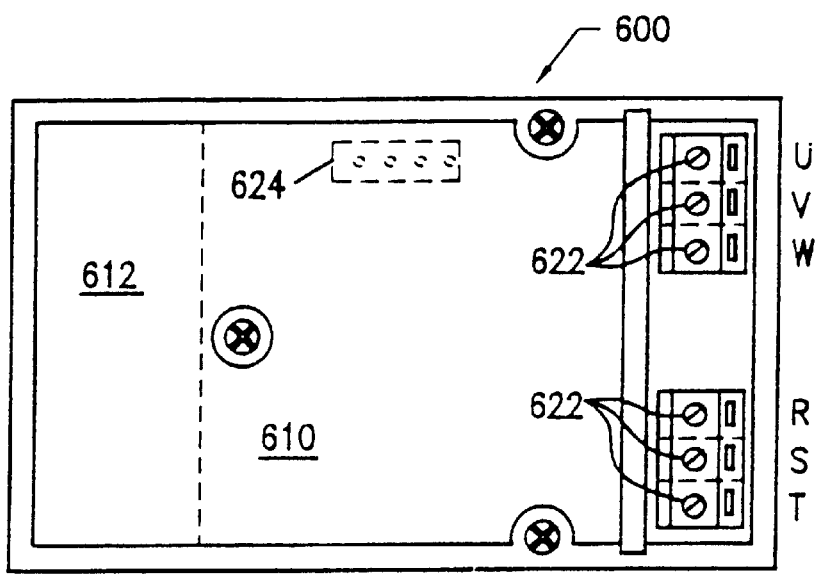
FIGS. 6A and 6B respectively show a top view and a cross-sectional view, of a micro-inverter module according to another aspect of the invention.
Figure 6B:
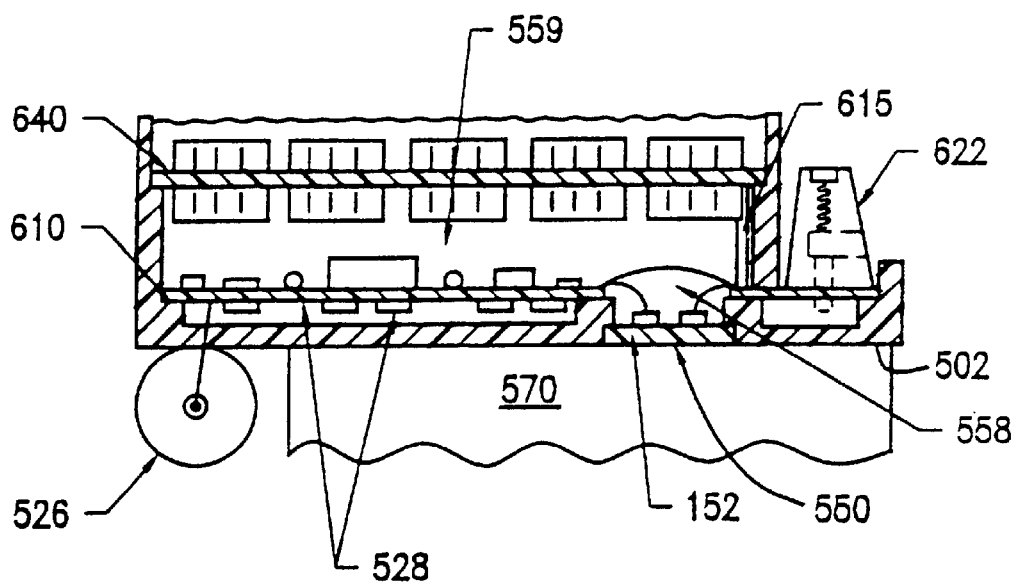
Figure 7A:
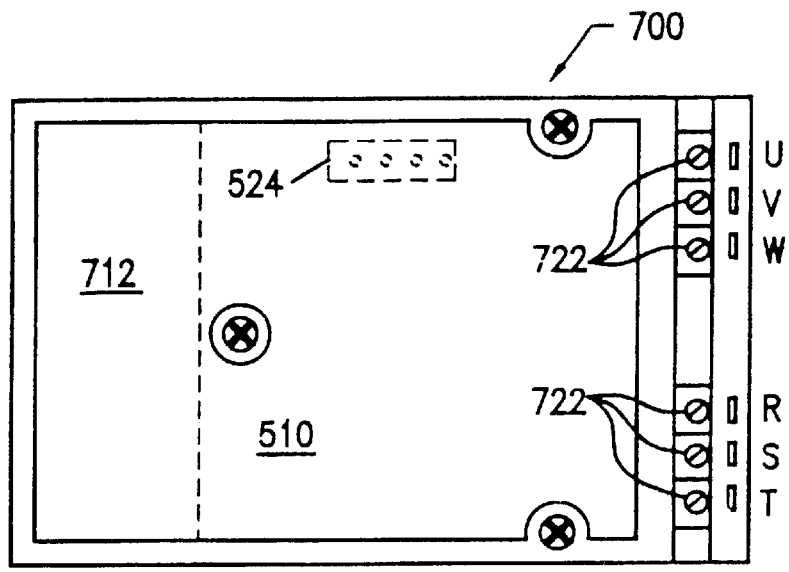
FIGS. 7A and 7B show a top view and a cross-sectional view, respectively, of a micro-inverter module according to still further embodiment of the invention.
Figure 7B:
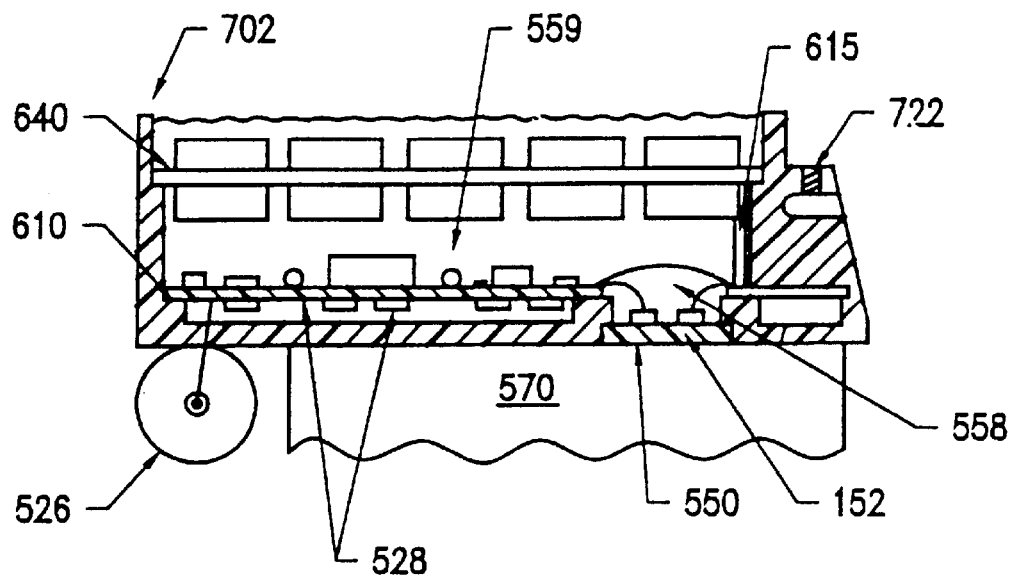

FIGS. 6A and 6B show an example of a micro-inverter APM package 600 with full input/output filters according to a further embodiment of the invention. This embodiment is similar to the appliance APM 500 except that an additional printed circuit board 640 is added for supporting the inductors and capacitors of the input/output filters. The added board 640 is connected to board 610 by interconnect lead frame 615. The size of the added board and its components will vary with power rating of the APM, which ranges typically between 0.1 to 1.0 HP. There are two terminal variations for the micro-inverter APM. Here, FIGS. 6A and 6B show a simple shell with procured terminals 622. Alternatively, FIGS. 7A and 7B show a substantially similar APM 700 with a shell 702 and integrated terminals 722. Note that with the procured terminals or the integrated terminals, the terminals are soldered to the main PCB with an isolated potting cavity. Optional input/output pins 624 are also shown.

Figure 8A:
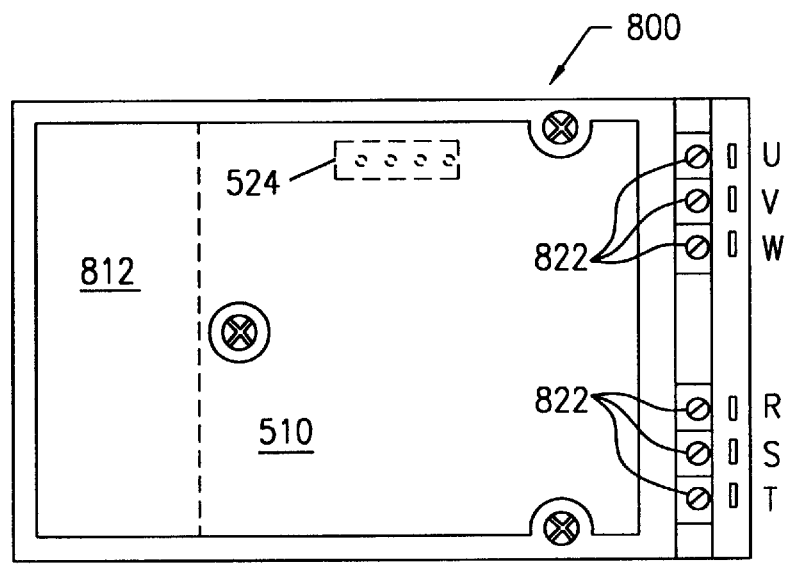
FIGS. 8A and 8B show a top view and cross-sectional view, respectively, of a micro-inverter module according to yet another embodiment of the invention.
Figure 8B:
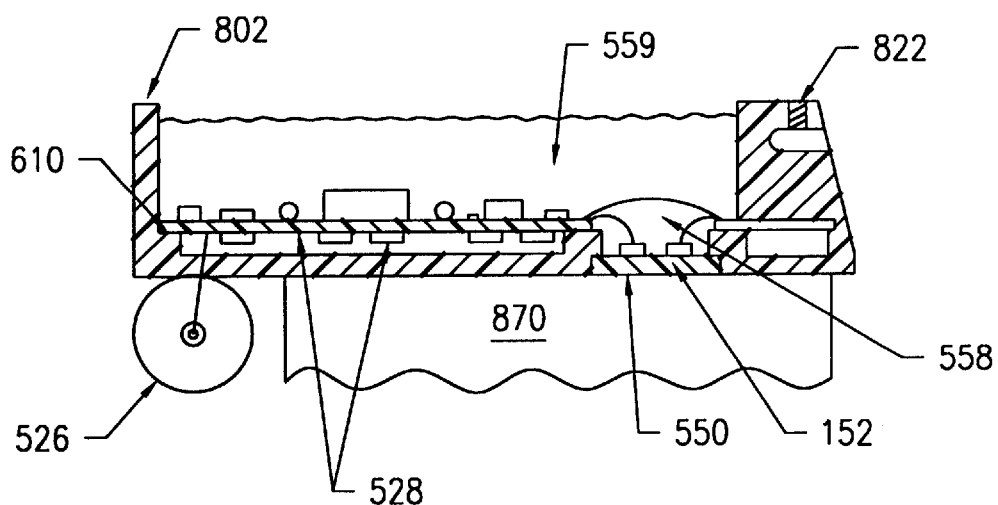

FIGS. 8A and 8B show an example of a micro-inverter APM package 800 with no filters in accordance with a still further embodiment of the invention. The package is similar to that of FIGS. 6A–6B and 7A–7B except the body height is reduced by the elimination of the added circuit board that otherwise holds the filter circuit. Instead, a buss capacitor 826 is mounted below the bottom surface of the base 802 but away from heatsink 870. Though FIGS. 8A and 8B show integrated shell terminals 822, the procured terminals are also an option.

The APM packages of FIGS. 6A–6B, 7A–7B and 8A–8B can also be modified to accommodate a keyboard 612, 712 or 812, respectively, on the top surface of the PCB. The packages can also accommodate a lid which may provide EMI shielding. The filtering and package of the invention are designed to minimize filter size and have an architecture such that common tooling and processing can be used where possible for more than one embodiment of the APM.

Figure 9A:
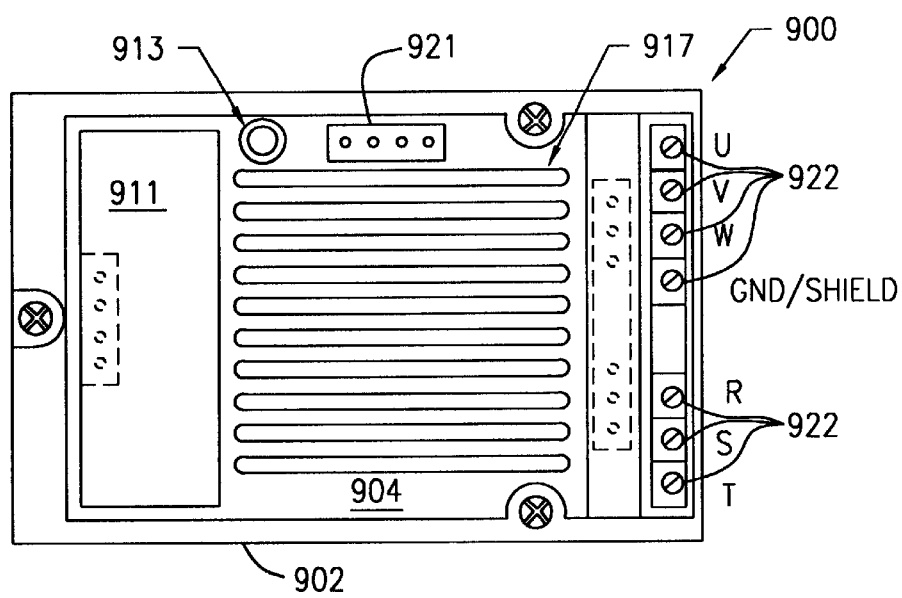
FIGS. 9A and 9B show respective top and cross-sectional views of an adaptable planar module according to another embodiment of the invention.
Figure 9B:
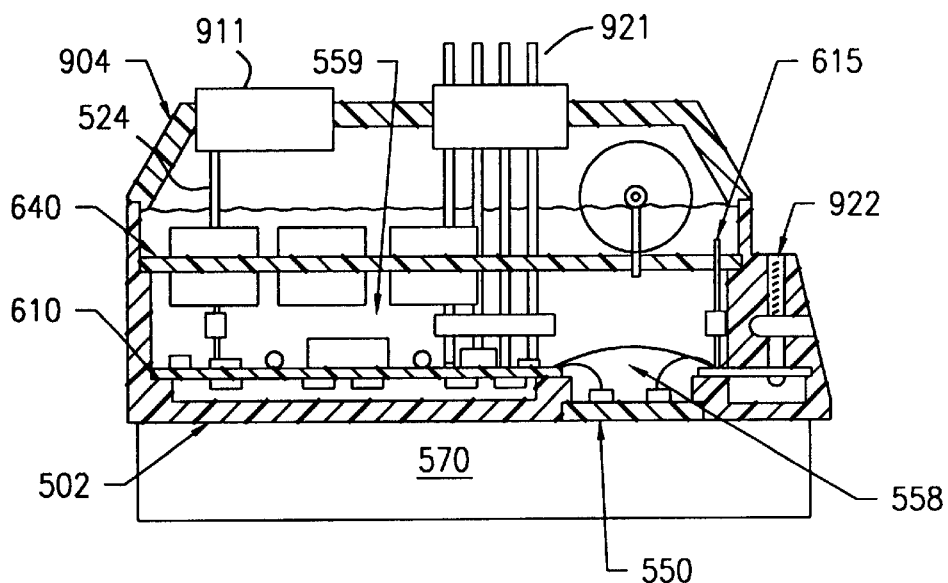

FIGS. 9A and 9B show top and cross-sectional views of an embodiment of a complete motor drive APM 900 with integrated terminals 922 in further accordance with the invention. Here, a molded cover lid 904 is shown which includes an input/output connector 921, LED 913 and air vents 917.

Figure 10A:
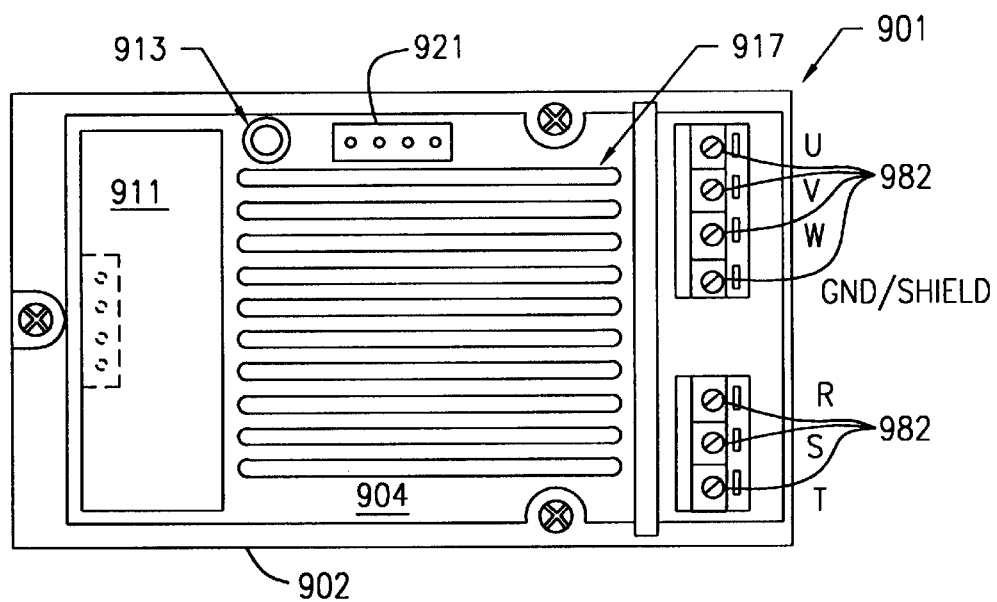
FIGS. 10A and 10B show a top view and a cross-sectional view, respectively, of an adaptable planar module according to still further embodiment of the invention.
Figure 10B:
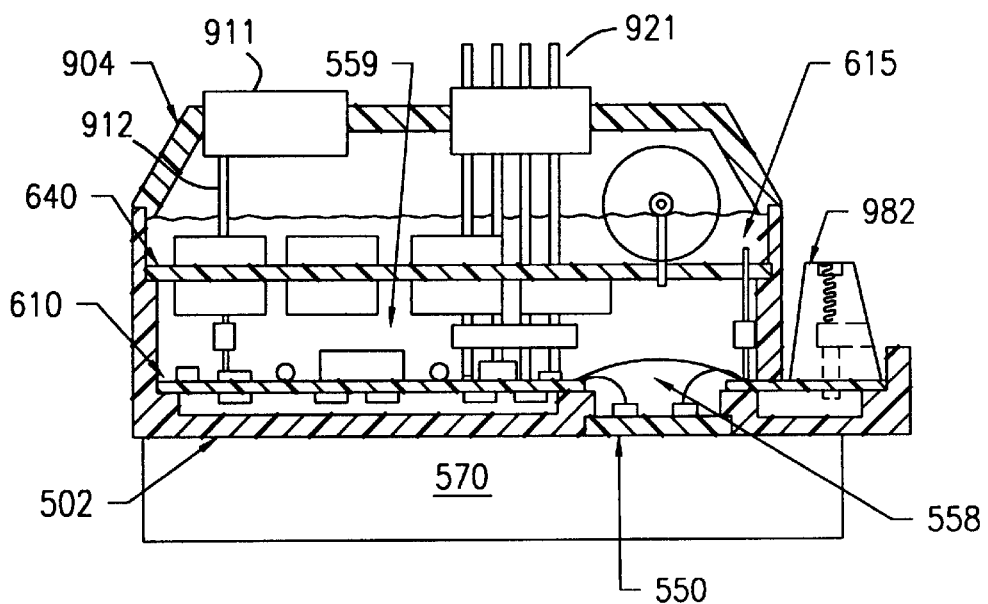

FIGS. 10A–10B show another example of a top and cross-sectional views of a complete motor drive APM 901 with attached terminals 982 according to another embodiment of the invention. The attached terminals 982 are substituted in place of integrated terminals 922 shown in FIGS. 9A–9B.

Figure 11:
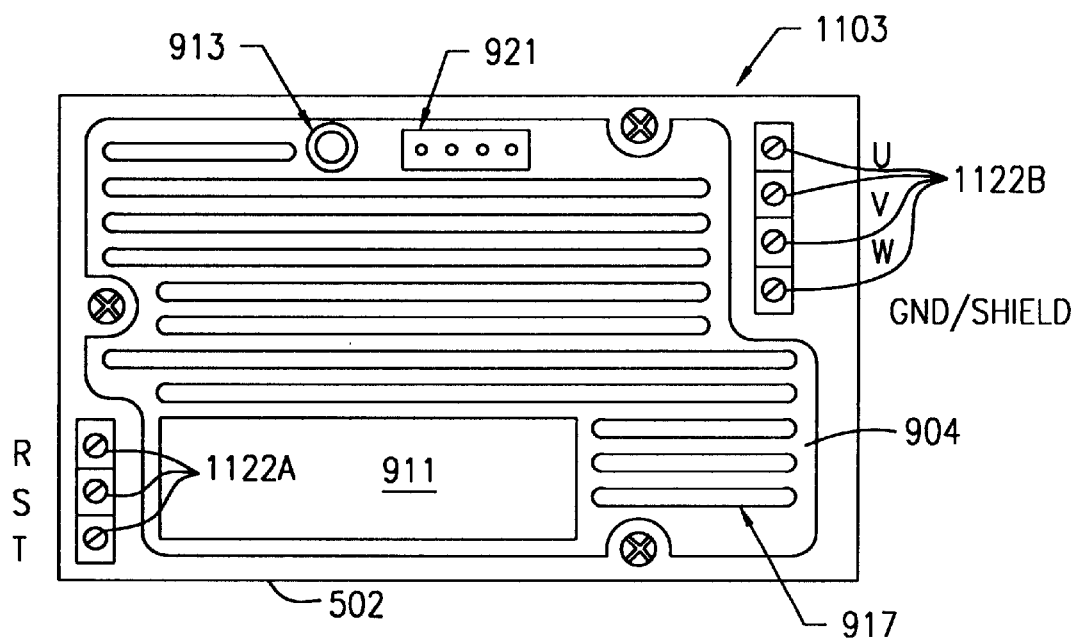
FIG. 11 shows a top view of an adaptable planar module according to an additional embodiment of the invention.

FIG. 11 shows a top view of another embodiment of a complete motor drive APM 1103 in accordance with the invention. In this example, integrated terminals 1122A and 1122B are located at opposite ends of the package.

Figure 12:
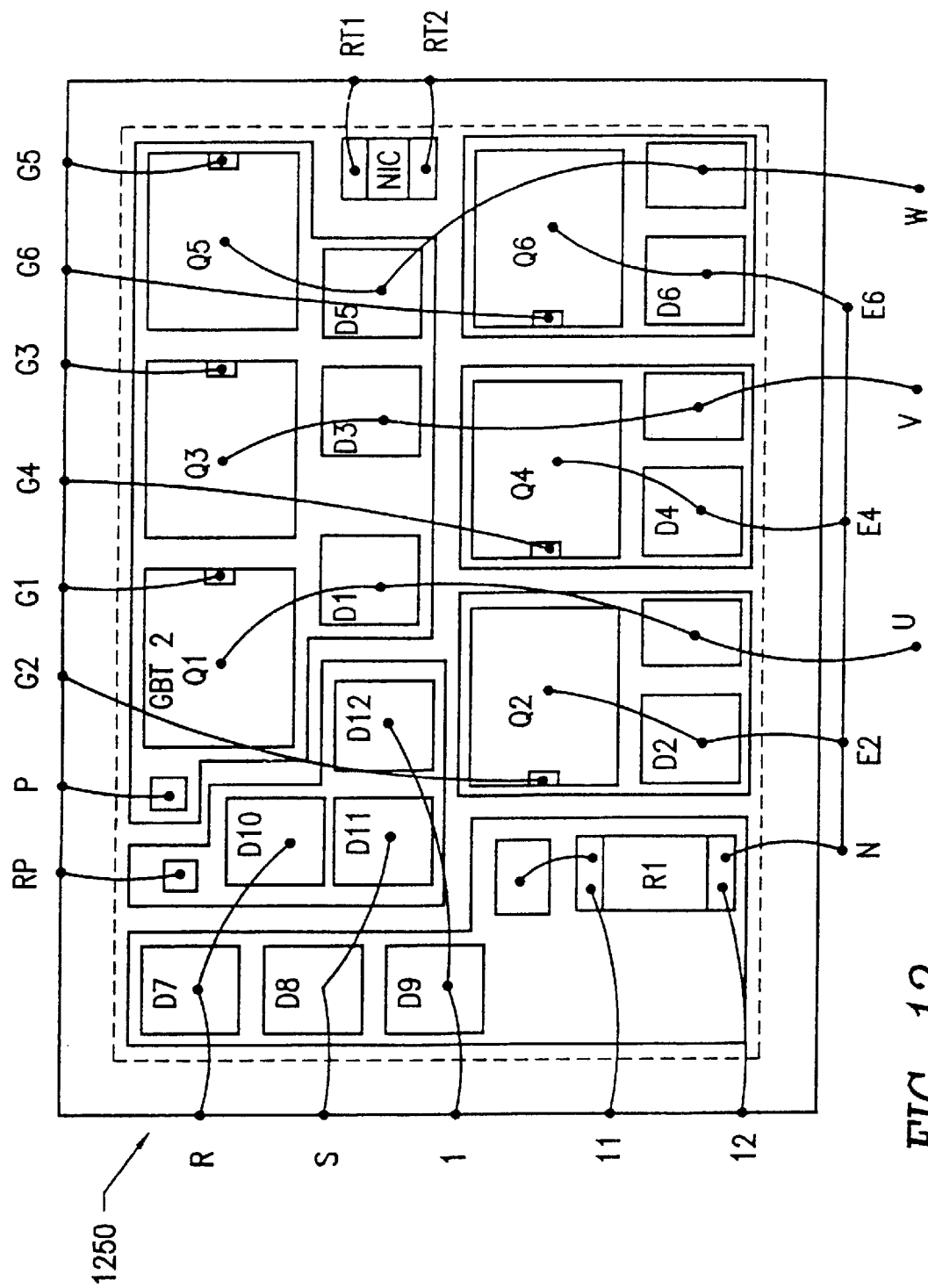
FIG. 12 shows a top view of a further arrangement of an IMS according to the invention.

FIG. 12 shows a further example of an IMS 1250 comprised of plural transistors, IGBTs, diodes and resistors which are interconnected as well as externally connected.

FIGS. 13A and 13B illustrate an embodiment of a ½ HP motor control module and drive circuit APM module 1200 which is likewise in accordance with the invention. As shown, the module includes a driver PCB 1210 and houses an IMS 1250, such as is shown in FIG. 13, which is connected to the driver PCB. A control board 1240 may be included in the module and arranged atop the driver circuit board, and a further optional keyboard 1244 may be included and arranged atop the control board.

Alternatively, the module is extended in length so that control circuits may be included on an extended driver PCB 1210A. Here, an extended keyboard 1244A may also be included in the module and arranged atop the extended circuit board.

Advantageously, the novel features of the above embodiment of the APM of the invention allow these products to be manufactured at lower cost. The primary cost reduction features include: 1) minimized IMS substrate area, 2) a thinner IMS substrate, 3) no wire bonds on the IMS metalization, 3) all tracks on a double side PCB, 4) all substrate-to-IMS connections are wire bonds that are ordinarily otherwise present, 5) an integrated driver and microprocessor printed circuit board, 6) an integrated shell/terminal molding option, 7) a single package for all functions with potting to reduce size and UL creepage path limitations, and 8) compatible tooling for European and U.S. products for both micro-inverter and appliance products.

The improvements in these features will be explained hereinafter in the following detailed descriptions.

Figure 18:
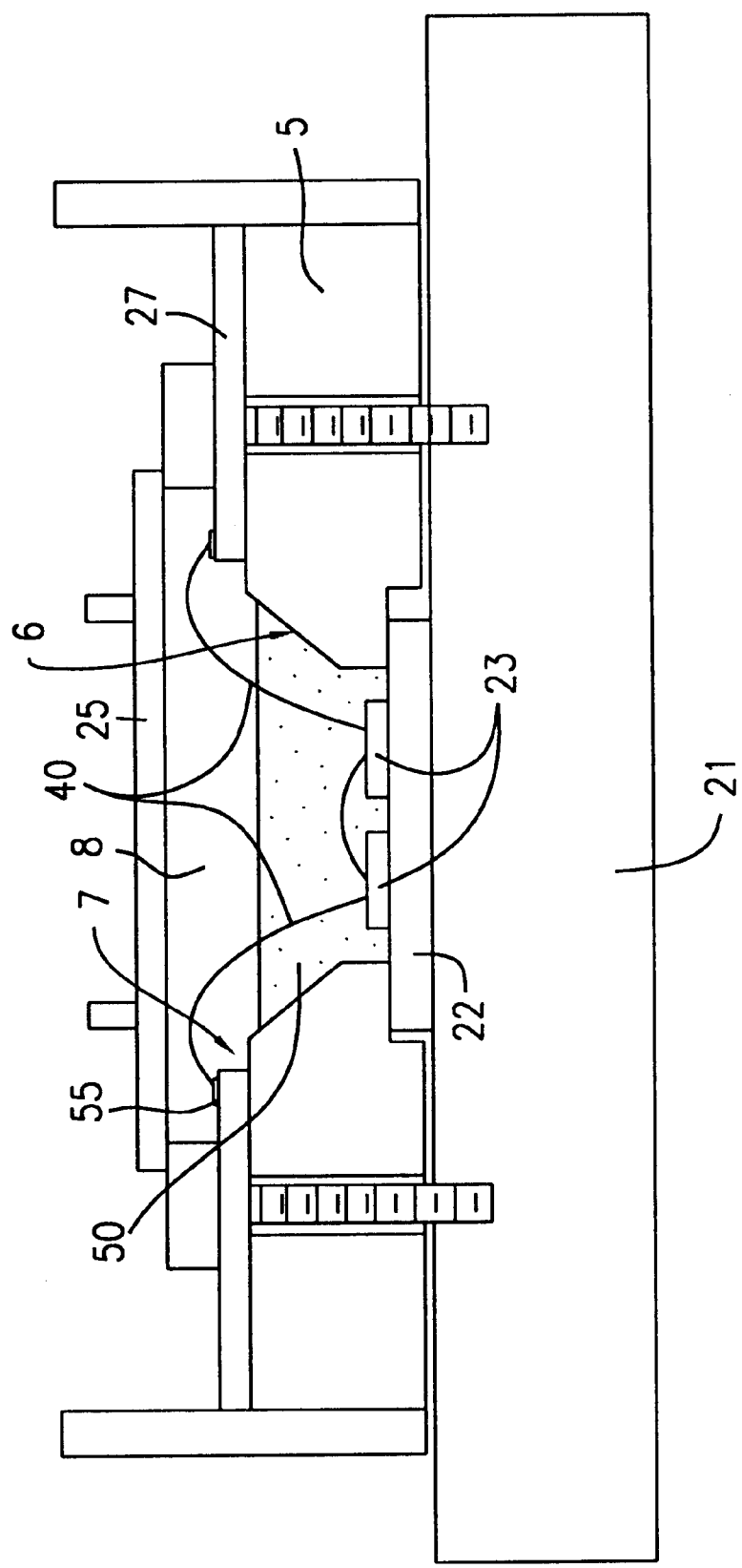
FIG. 18 is a cross-sectional view of a semiconductor device module including a shell for supporting a substrate and a PCB to provide a module, which is then mounted on a heatsink as shown.

Referring first to FIG. 18, there is provided an APM 90 according to the invention disclosed in the pending U.S. patent application No. 09/197,078, filed on Nov. 20, 1998, by the applicants of the instant application, and assigned to the same assignor of the instant application. FIG. 18 shows an APM including a thermally conductive substrate 22 that is thermally connected to a heatsink 21 so that the heat that is generated by a semiconductor device 23 residing on the thermally conductive substrate 22 may be withdrawn. A shell 5 is provided to house the components of the module. A cavity 6 in the shell allows the semiconductor device to be electrically connected to a component (not shown) on a PCB 27, which is mounted on the top side of the shell 5, by the aid of a bonding wire 40, that extends through the cavity 6 in the shell and a cavity 7 provided in the PCB 27. As shown, the cavity 7 in the PCB and the cavity 6 in the shell 5 coincide to allow for the passage of the bonding wire 40. The bonding wire 40 is electrically connected at one end to the semiconductor device 23 and at the other end to a bonding pad 55. The bonding pad 55 is electrically connected to a component or device on the PCB, thereby allowing electrical communication between the semiconductor device 23 and the component or device. Many bonding pads may be provided as needed. The bonding pads may be disposed along the periphery of the cavity 7 in the PCB 27 on the top side. Multiple electrical connections between multiple semiconductor devices residing on the thermally conductive substrate and various components on the PCB may be made in the same manner. A cover 25 is provided over the cavity 7 in the PCB 27 to enclose a space 8 over the thermally conductive substrate. The enclosed space 8 contains a potting compound 50.

The foregoing module has been described in detail in Ser. No. 09/197,078. This module may be further improved by making the cover 25 from a suitable conductive shielding material or applying a conductive shield to the cover. Conductive shielding will reduce the RFI noise that emanates from the bonding wires.

Figure 18A:
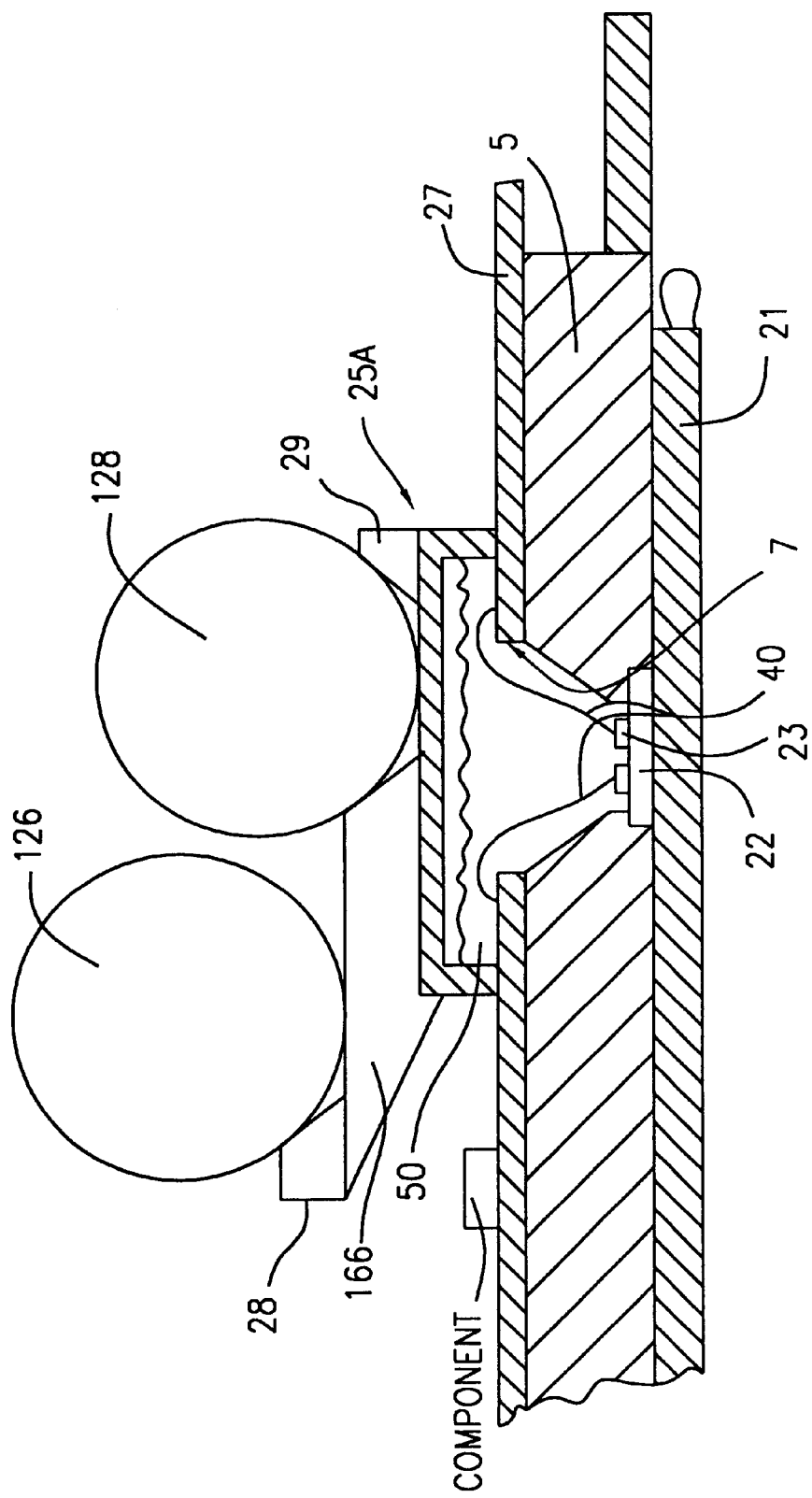
FIG. 18A is a cross-sectional view of a semiconductor device module of FIG. 5 further showing a support structure for supporting capacitors atop a cover.

Furthermore, as shown in FIG. 18A, the top of the cover may be modified to include features for supporting capacitors. The specific embodiment shown in FIG. 18A includes a cover 25A that has been modified to provide support to two capacitors 126, 128, a first capacitor 126 and a second capacitor 128. The capacitors 126, 128 are both cylindrically shaped, and rest on their sides above the top side of the cover. The first capacitor 126 rests upon a first plane, which may be substantially parallel to the plane of the top of the cover. The second capacitor 128 rests upon a support tray 131, which supports the second capacitor on a second plane above, and substantially parallel to the first plane. This step-like configuration for positioning the capacitors allows part of the second capacitor to extend outside of the edge of the cover. Further, because the second capacitor is supported above the top face of the cover, an area on the PCB 27 is available under the support tray 131 with sufficient vertical clearance for placement of components on the PCB 27 as shown.

Two stop members 29, 28, a first stop member 29 and a second stop member 28, provide lateral support so that the capacitors 126, 128 will not fall off the cover. The first stop member 29 prevents the first capacitor 128 from slipping or falling off an edge of the cover; while the second stop member 28 prevents the second capacitor 126 from slipping or falling off an opposite edge on the cover. The support tray 131, the two stop members 28, 29, and the cover are of unitary configuration, and are made of a polymer of suitable mechanical, electrical and thermal characteristics.

While the features of the foregoing APM embodiments provide for advantageous results as fully detailed in application Ser. No. 09/197,078, and those described in the instant application, modifications to that embodiment provide further advantageous features as hereinafter described.

Figure 14:
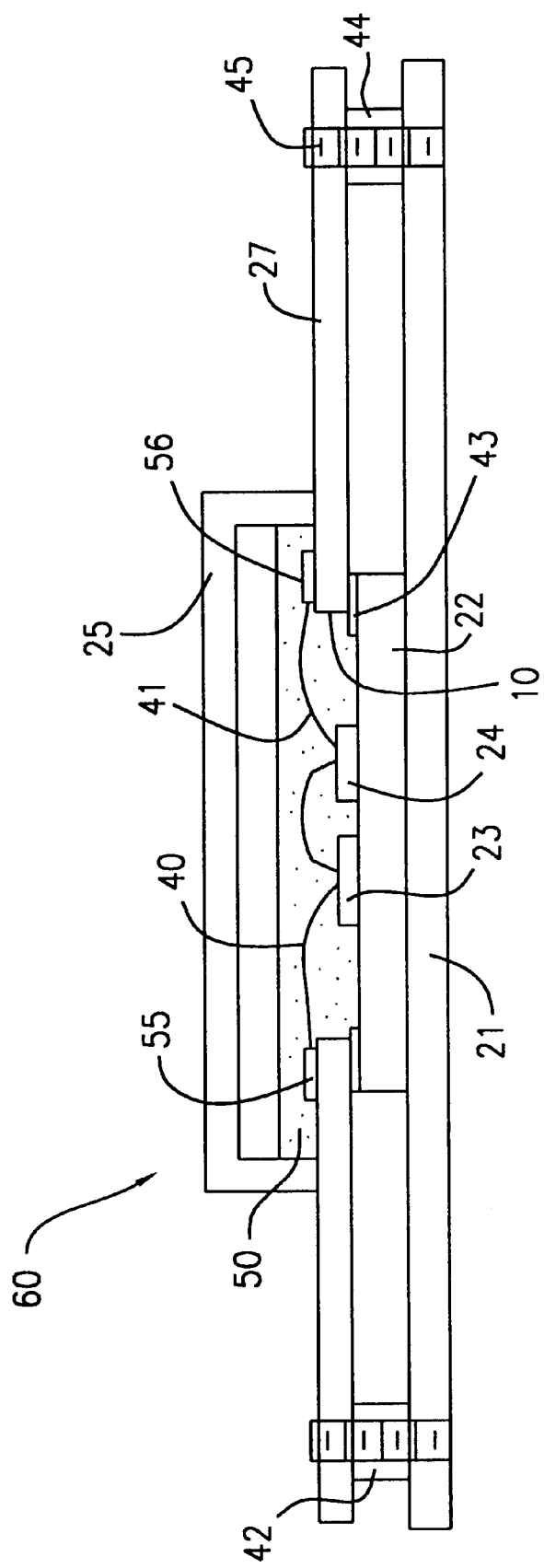
FIG. 14 is a cross-sectional view of an embodiment of a semiconductor device module according to the present invention.

Referring now to FIG. 14, there is shown an FPA 60 according to the present invention.

The FPA includes one or a plurality of semiconductor devices 23 mounted atop a thermally conductive substrate 22. The thermally conductive substrate 22 is directly attached to a heat sink 21. A PCB 27 is provided above the thermally conductive substrate 22. The PCB 27 includes a cavity 10, which is positioned over the thermally conductive substrate 22. The outer edges on the top side of the thermally conductive substrate 22 are attached by double sided adhesive tape 43 or other suitable means to the underside of the PCB 27 along the under-edges of the cavity 10 such that the cavity 10 is closed by the thermally conductive substrate 22.

A bonding pad 55 is disposed on the periphery of the cavity on the top side of the PCB 27, and is connected to at least one device (not shown) on the PCB 27. Bonding wire 40 electrically connects the semiconductor device 23 to the bonding pad 55, thereby placing the semiconductor device in electrical communication with the device on the PCB. There is also shown another semiconductor device 24 which is in electrical communication with a device (not shown) on the PCB 27 by a bonding wire 41 that is electrically connected to another bonding pad 56.

A molded cover 25 is placed over the cavity 10 in the PCB 27 to enclose a space over the exposed semiconductor devices. A potting compound 50 is contained in the space. PCB standoffs 42, 44 provide support to the PCB 27; while a screw 45 or other appropriate mounting means such as a clip secures the PCB 27 on the heatsink 21.

The FPA of FIG. 14 eliminates the need for a complex rugged shell, thereby eliminating the cost associated with including such shells in the manufacturing of these modules. Instead, a shell cover made from much cheaper materials may be used. The molded cover may also be manufactured from low strength, low temperature grade material to further reduce the cost of manufacturing.

Advantageously, the FPA of FIG. 14 also requires shorter bonding wires, which results in more reliable and manufacturable electrical bonds between the semiconductor devices and the PCB. Shorter bonding wires also reduce the radiated RFI energy emanating from the bonding wires.

Further, the use of double sided adhesive tape 43 between the PCB and the thermally conductive substrate can provide suitable insulation for FPAs intended for high voltage application (>42 V) to meet creepage requirements of UL.

Figure 15:
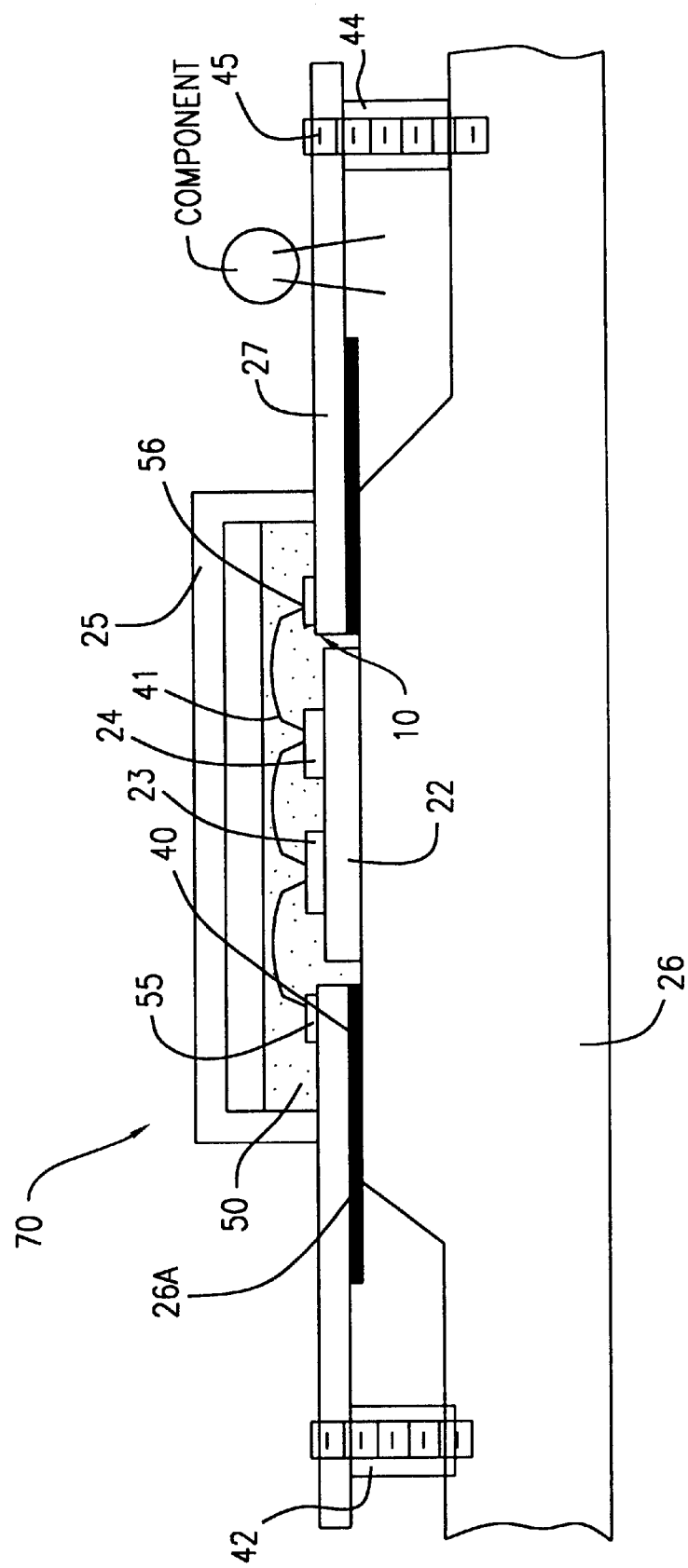
FIG. 15 is a cross-sectional view of an embodiment of a semiconductor device module according to the present invention that includes a heatsink with a raised platform below the thermally conductive substrate.

In FIG. 15, another embodiment of an FPA 70 according to the present invention is shown. In this embodiment, a heatsink 26 includes a raised portion, which provides a platform under the thermally conductive substrate 22. The platform may be made on a basic heatsink by one of many ways such as extrusion, insertion of additional metal, bumping or stamping. By providing the platform, the PCB 27 is placed farther away from the heatsink, thus it is not heated by the heatsink. Coating the heatsink with a thermally nonconductive coating further prevents the heatsink from heating the PCB. Additionally, application of an electrically insulating coat 26A applied or stuck to the heatsink may obviate safety concerns.

The embodiment of the invention as shown in FIG. 15 is particularly useful where safety requirements (such as UL and VDE requirements) mandate minimum amount of strike and creepage distances that cannot use the structure that is shown in the embodiment shown in FIG. 14.

Another advantageous aspect of the FPA shown in FIG. 15 is the reduction in the length of the bonding distance as the substrate's top face is closer to the PCB's top face, which reduction as discussed previously reduces the amount RFI. As another result of the closeness of the top face of the substrate to the PCB's top face, the volume of the space created by the molded cover is reduce, thus requiring less potting compound, which in turn reduces the cost of manufacturing the FPA.

Figure 16:
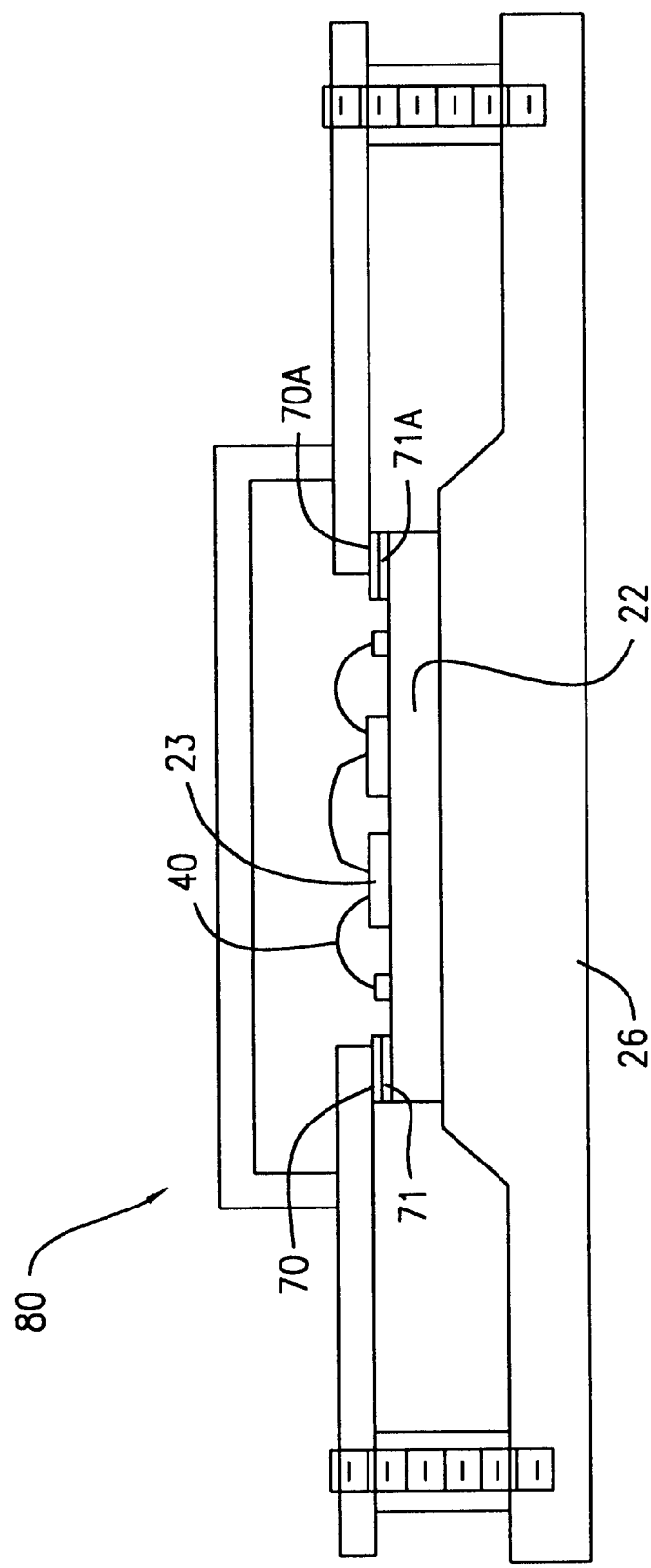
FIG. 16 is a cross-sectional view of an embodiment of a semiconductor device module according to the present invention that includes a heatsink with a raised platform, similar to the module in FIG. 2, and further showing electrical connection between a semiconductor device and PCB components by electrical contacts provided on the top side of the substrate and the bottom side of the PCB.

Another embodiment of an FPA 80 in accord with the invention is shown in FIG. 16. There is shown an FPA including a heatsink 26 having a platform under a thermally conductive substrate 22. An electrical contact pad 71 is provided on the substrate, which is in electrical communication with a semiconductor device 23 through a bonding wire 40. The bonding wire may be electrically connected to an electrical bonding pad residing on the substrate 22 which is electrically connected to the electrical contact pad 71. Another electrical contact pad 70 is provided on the PCB 27, which contact is electrically connected to another device (not shown) on the PCB 27. The electrical contact pad 70 on the PCB and electrical contact pad 71 on the thermally conductive substrate are in touch to provide electrical communication between a semiconductor device 23 and a device (not shown) on the PCB 27. Such a configuration advantageously allows for the testing of the semiconductor devices before assembly, thus reducing the number of rejected products during the manufacturing, which in turn provides cost savings.

Figure 17:
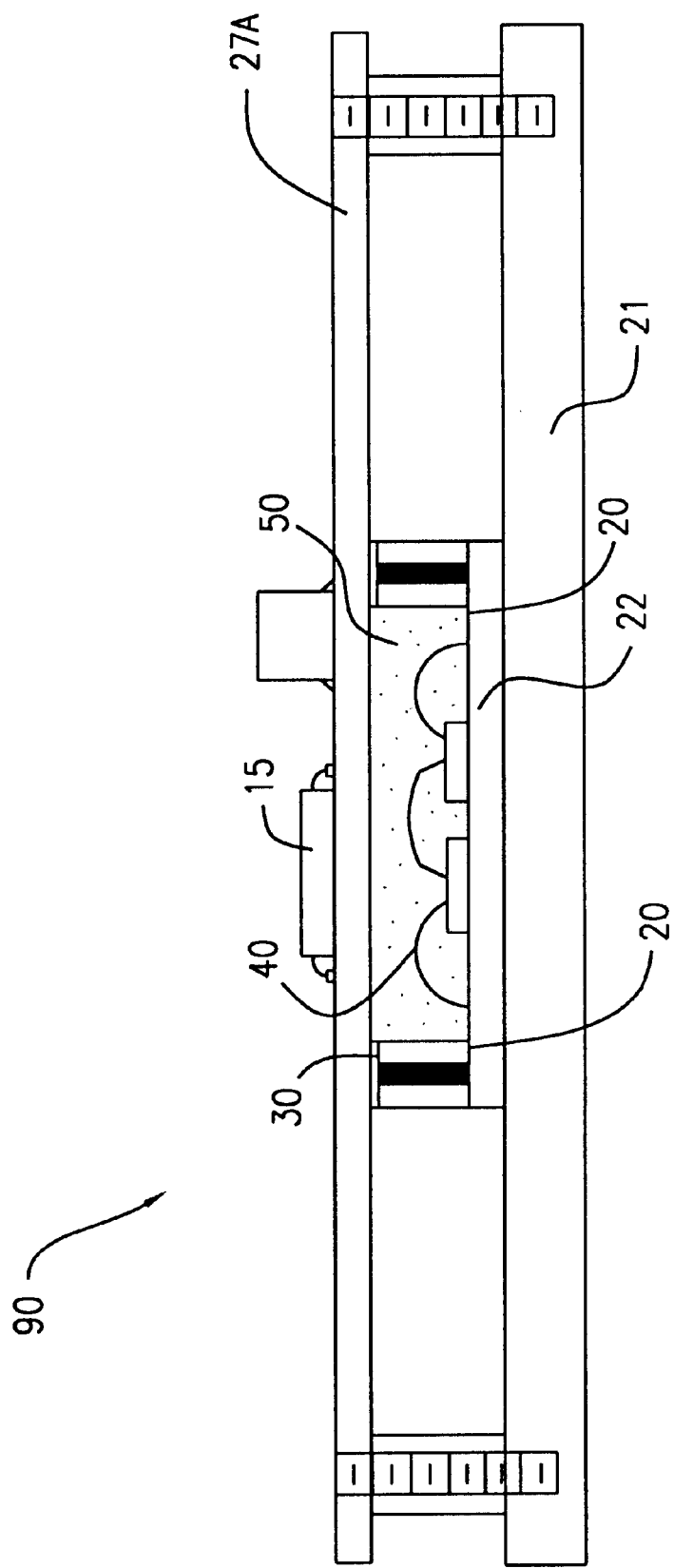
FIG. 17 shows a cross-sectional view of an embodiment of a semiconductor device module according to the present invention in which a PCB is shown mounted over the substrate, and the semiconductor devices are electrically connected to the PCB components by vias.

FIG. 17 illustrates yet another embodiment of an FPA 90 according to the present invention. In this embodiment, a PCB 27A is positioned above and spaced away from a thermally conductive substrate 22. No cavity is provided in the PCB 27A. An enclosure means 20 is lodged between the underside of the PCB 27A and the top side of the thermally conductive substrate 22. The enclosure means 20 encloses a space above the thermally conductive substrate 22, which space contains a suitable potting compound 50. There is also provided a via 30 or a plurality of vias in the enclosure means 20 to electrically connect a device 15 to a semiconductor device 23 on the thermally conductive substrate 22. The enclosure means is made from a suitable insulating material. A bonding wire 40 that is electrically connected to the semiconductor device 23 at one end, and in electrical communication with a via, for example via 30, at the other end, thus provides electrical communication between the semiconductor device 23 and the device 15 or other devices on the PCB 27A.

The embodiment of the invention according to FIG. 17 eliminates the need for a molded cover. Advantageously, the elimination of the cavity from the PCB provides for more surface area on the PCB for mounting devices or components, thereby allowing smaller modules to be constructed according to the present invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device module comprising:

a heatsink having a top surface and a bottom surface;

a planar, thermally conductive substrate having a top surface including a surface area and a bottom surface thermally connected to said top surface of said heatsink;

at least one semiconductor device mounted on said top surface of said thermally conductive substrate;

at least one circuit board, having a bottom surface and a top surface, arranged above and spaced from said top surface of said thermally conductive substrate, said circuit board having an opening therein that is situated above said thermally conductive substrate, said opening having an opening area, wherein said at least one semiconductor device on said conductive substrate is exposed through said opening; and at least another device mounted on said circuit board, said another device being electrically connected to said semiconductor device on said thermally conductive substrate;

wherein said circuit board is directly mounted on said heatsink.

2. The semiconductor device module of claim 1, wherein said thermally conductive substrate has an outer rim and wherein said outer rim of said top surface of said thermally conductive substrate is adhesively attached to said bottom surface of said circuit board thereby closing said opening.

3. The semiconductor device module of claim 1, wherein said thermally conductive substrate has an outer rim and wherein said outer rim of said top surface of said thermally conductive substrate is adhesively attached to said bottom surface of said circuit board by adhesive tape.

4. The semiconductor device module of claim 1, wherein said at least one semiconductor device is electrically connected to said another device by a bonding wire.

5. The semiconductor device module of claim 1, further comprising at least one bonding pad disposed along the periphery of said opening and electrically connected to said semiconductor device by a bonding wire.

6. The semiconductor device module of claim 1, further comprising a molded cover disposed on said top surface of said circuit board enclosing a space above said opening in said circuit board.

7. The semiconductor device module of claim 6, wherein said space enclosed by said molded cover contains potting material.

8. The semiconductor device module of claim 1, wherein said circuit board is directly supported on said heatsink by at least one standoff and mounted on said heatsink by a screw.

9. The semiconductor device module of claim 1, wherein said thermally conductive substrate is an insulated metal substrate.

10. The semiconductor device module of claim 1, wherein a portion of said top surface of said heatsink is raised to provide a platform under said bottom surface of said thermally conductive substrate.

11. The semiconductor device module of claim 10, wherein said surface area of said top surface of said thermally conductive substrate is smaller than said opening thereby allowing said substrate to fit through said opening, further comprising insulation means tucked between a rim around said opening on said bottom surface of said circuit board and said top surface of said platform on said heatsink.

12. The semiconductor device module of claim 11, further comprising a molded cover disposed on said top surface of said circuit board to enclose a space over said opening in said circuit board.

13. The semiconductor device module of claim 12, wherein said space enclosed by said molded cover contains potting material.

14. The semiconductor device module of claim 11, wherein said surface area of said top surface of said thermally conductive substrate is larger than said opening area, thereby preventing said substrate from fitting through said opening, further comprising at least one electrical contact on said top surface of said thermally conductive substrate electrically connected to said semiconductor device by at least one bonding wire, said at least one electrical contact electrically touching at least another electrical contact disposed on said bottom surface of said circuit board, said another contact being electrically connected to said at least another device on said circuit board.

15. The semiconductor device module of claim 14, wherein said opening in said circuit board is closed by said thermally conductive substrate.

16. The semiconductor device module of claim 15, further comprising a molded cover disposed on said top surface of said circuit board, said molding cover enclosing a space over said opening in said circuit board.

17. The semiconductor device module of claim 16, wherein said space contains potting material.

18. A semiconductor device module comprising:
 a heatsink having a top surface and a bottom surface;
 a planar, thermally conductive substrate having a top surface and a bottom surface thermally connected to said top surface of said heatsink;
 at least one semiconductor device mounted on said top surface of said thermally conductive substrate;
 at least one circuit board, having a bottom surface and a top surface, arranged above and spaced from said top surface of said thermally conductive substrate;
 an enclosure means disposed between said top surface of said thermally conductive substrate and said bottom surface of said circuit board to define a space between said thermally conductive substrate and said bottom of said circuit board;
 at least one via for providing electrical communication from said semiconductor device to said top of said circuit board;
 at least one bonding wire electrically connecting said semiconductor device to said via;
 at least another device mounted on said top surface of said circuit board and electrically connected to said via.

19. The semiconductor device module of claim 18, wherein said circuit board is mounted on said top surface of said heatsink.

20. The semiconductor device module of claim 19, wherein said circuit board is supported on said top surface of said heatsink by at least one circuit board standoff and mounted on said heatsink by at least one screw.

21. The semiconductor device module of claim 18, wherein the space between said thermally conductive substrate and said bottom of said circuit board contains a potting material.

22. The semiconductor device module of claim 21, wherein said potting material is a gel.

23. The semiconductor device module of claim 18, wherein said thermally conductive substrate is an insulated metal substrate.

24. An improved semiconductor device module of the type made from the combination of a support base having top and bottom surfaces and having an opening therein which extends from said top surface to said bottom surface, a length and a width of said support base defining a first area; a planar, thermally conductive substrate disposed in said opening in said support base such that a bottom surface of said substrate is disposed to contact an external heatsink located beneath said bottom surface of said support base, a length and a width of said planar, thermally conductive substrate defining a second area such that said first area is at least approximately six times larger than said second area; at least one semiconductor device mounted on a top surface of said thermally conductive substrate; at least one circuit board arranged above and spaced from said top surface of said base and having an opening therein that is situated above said thermally conductive substrate; at least another device mounted on a top surface of said circuit board; said top surface of said circuit board having at least one bonding pad area arranged at a periphery of said opening in said circuit board and being electrically connected to said another device; at least one bonding wire for connecting said one semiconductor device to said bonding pad; and a cover, having a planar top face, situated above said circuit board and said thermally conductive substrate wherein the improvement comprises:
 application of a conductive shielding material to said cover to reduce the allowance of radiated RFI noise from said at least one bonding wires.

25. The improved semiconductor device module of claim 24, wherein said cover is made from said conductive shielding material.

26. The improved semiconductor device module of claim 24, wherein said cover provides support to at least one capacitor.

27. The improved semiconductor device module of claim 26, wherein a first capacitor and a second capacitor, each being cylindrically shaped and each having a side, are supported on their said respective sides on a first plane and a second plane respectively above said cover by means of a support structure, said support structure comprising, a first stop member restricting the lateral movement of said first capacitor to prevent the same from falling over said top of said cover; a second stop member restricting the lateral movement of said second capacitor, said second stop member integrally attached to a support means to vertically support said second capacitor on a plane above said top of said first plate, said stop member preventing said second capacitor from falling over said top of said cover; said first stop member, said second stop member, and said support means being integrally formed on said top of said cover.

28. The improved semiconductor device module of claim 24 or 25, wherein a potting material is contained within a space created by said molded cover and said circuit board.

29. The improved semiconductor device module according to claim 28, wherein said potting material is a gel.

30. The improved semiconductor device of claim 24, wherein said thermally conductive substrate is an insulated metal substrate.

* * * * *